(12) United States Patent
Zehavi et al.

(10) Patent No.: US 10,446,254 B1
(45) Date of Patent: Oct. 15, 2019

(54) METHOD FOR MAXIMIZING POWER EFFICIENCY IN MEMORY INTERFACE BLOCK

(71) Applicant: Western Digital Technologies, Inc., San Jose, CA (US)

(72) Inventors: Mordekhay Zehavi, Raanana (IL); Mahmud Asfur, Bat-Yam (IL); Yonatan Tzafrir, Petah Tikva (IL)

(73) Assignee: WESTERN DIGITAL TECHNOLOGIES, Inc., San Jose, CA (US)

( * ) Notice: Subject to any disclaimer, the term of this patent is extended or adjusted under 35 U.S.C. 154(b) by 0 days.

(21) Appl. No.: 15/970,832

(22) Filed: May 3, 2018

(51) Int. Cl.
*G11C 29/50* (2006.01)
*G06F 11/07* (2006.01)

(52) U.S. Cl.
CPC .......... *G11C 29/50* (2013.01); *G06F 11/0796* (2013.01); *G11C 2029/5004* (2013.01)

(58) Field of Classification Search
CPC ................................. G11C 29/50; G11C 7/00
USPC ........................................ 365/201, 189.011
See application file for complete search history.

(56) References Cited

U.S. PATENT DOCUMENTS

| | | | | |
|---|---|---|---|---|
| 7,558,109 | B2* | 7/2009 | Brandman | G06F 11/1072 365/185.03 |
| 7,861,122 | B2* | 12/2010 | Cornwell | G06F 11/073 711/103 |
| 8,631,191 | B2* | 1/2014 | Hashimoto | G06F 3/0616 711/103 |
| 8,706,955 | B2* | 4/2014 | Fai | G06F 9/4416 711/103 |
| 9,343,121 | B2* | 5/2016 | Jang | G11C 7/04 |
| 9,484,115 | B1* | 11/2016 | Felix | G11C 29/08 |
| 2006/0085166 | A1* | 4/2006 | Ochi | G06F 11/3409 702/186 |
| 2007/0030741 | A1 | 2/2007 | Nii et al. | |
| 2007/0045825 | A1 | 3/2007 | Chan et al. | |
| 2007/0208957 | A1* | 9/2007 | Leis | G06F 1/30 713/300 |
| 2008/0002465 | A1* | 1/2008 | Murin | G11C 8/10 365/185.03 |

(Continued)

OTHER PUBLICATIONS

International Search Report and Written Opinion issued in corresponding International Application No. PCT/US2019/017487, dated May 30, 2019 (13 pages).

*Primary Examiner* — Michael T Tran
(74) *Attorney, Agent, or Firm* — Patterson & Sheridan, LLP; Steven H. Versteeg

(57) ABSTRACT

A data storage device includes a controller and a memory. The controller includes a host interface and a memory interface. The controller writes a first data test to a memory device through either the host interface or the memory interface at a first voltage level to determine a first write value. The controller reads the first data test written to the memory device through the same interface, either the host interface or the memory interface, at a second voltage level to determine a first read value. The controller then changes the second voltage to a third voltage based on a determination of whether the first read value is equal to the first write value to dynamically alter a working voltage level of the storage device in response to changing process, voltage, and temperature conditions.

25 Claims, 6 Drawing Sheets

(56) References Cited

U.S. PATENT DOCUMENTS

| | | | |
|---|---|---|---|
| 2008/0219078 A1* | 9/2008 | Kamiyama | G11C 5/143 365/226 |
| 2009/0016140 A1 | 1/2009 | Qureshi et al. | |
| 2009/0135646 A1* | 5/2009 | Murin | G11C 11/5642 365/185.2 |
| 2009/0235015 A1* | 9/2009 | Hatsuda | G06F 12/0866 711/103 |
| 2009/0323446 A1 | 12/2009 | Zhang et al. | |
| 2010/0097858 A1* | 4/2010 | Tokiwa | G11C 16/0483 365/185.05 |
| 2010/0117450 A1* | 5/2010 | Azrai | G01R 19/0092 307/31 |
| 2010/0180068 A1* | 7/2010 | Matsumoto | G06F 11/1441 711/103 |
| 2010/0257306 A1* | 10/2010 | Kawaguchi | G06F 3/0616 711/103 |
| 2011/0231690 A1* | 9/2011 | Honda | G11C 5/147 713/340 |
| 2012/0059972 A1* | 3/2012 | Chen | G06F 12/0246 711/4 |
| 2012/0084490 A1* | 4/2012 | Choi | G11C 16/02 711/103 |
| 2013/0021852 A1* | 1/2013 | Jeong | G11C 16/28 365/189.05 |
| 2013/0024600 A1* | 1/2013 | Wakrat | G06F 12/0246 711/103 |
| 2013/0046917 A1* | 2/2013 | Yang | G06F 12/0246 711/103 |
| 2013/0208552 A1* | 8/2013 | Chen | G11C 11/5628 365/189.15 |
| 2013/0250702 A1* | 9/2013 | Sakurai | G11C 5/147 365/189.09 |
| 2014/0032939 A1* | 1/2014 | Jeddeloh | G06F 1/3234 713/300 |
| 2015/0003181 A1* | 1/2015 | Droege | G11C 5/147 365/226 |
| 2015/0028931 A1 | 1/2015 | Xie et al. | |
| 2015/0262677 A1* | 9/2015 | Lin | G11C 7/02 365/185.12 |
| 2015/0309737 A1* | 10/2015 | Kim | G06F 3/0611 711/103 |
| 2016/0240256 A1* | 8/2016 | Lin | G11C 16/0483 |
| 2016/0329084 A1* | 11/2016 | Han | G11C 29/1201 |
| 2017/0109040 A1* | 4/2017 | Raghu | G06F 3/061 |
| 2017/0115916 A1* | 4/2017 | Jayachandran | G11C 5/147 |
| 2017/0287568 A1* | 10/2017 | Yang | G11C 16/3431 |
| 2018/0277187 A1* | 9/2018 | Ikegami | G11C 13/004 |
| 2018/0286495 A1* | 10/2018 | Oh | G11C 29/50004 |
| 2019/0056880 A1 | 2/2019 | Tzafrir et al. | |

* cited by examiner

METHOD FOR MAXIMIZING POWER EFFICIENCY IN MEMORY INTERFACE BLOCK

BACKGROUND

Field

The disclosure is generally related to data storage devices and more specifically to an interface bus between components of a data storage device.

Description of the Related Art

During operation of a data storage device, data may be communicated between a controller and a memory of the data storage device via a data bus that couples the controller and the memory. The speed at which data can be communicated between the controller and the memory of the data storage device is an important factor. However, several common events may occur that negatively influence the speed. For example, such events may include the speed limitations of the data storage device itself, changes in operating temperature to the data storage device, and changes in power usage of the data storage device. Each of these events can reduce the operating speed of the data storage device, and result in the process, voltage, and temperature (PVT) conditions of the device to frequently change.

PVT conditions of storage devices are dynamic, and may widely vary between different devices and working environments at any given time. To improve reliable performance of storage devices at maximum system frequency, a specific voltage level is selected to cover all PVT conditions, and is typically selected to ensure devices can handle worst case scenarios, such as a slow device operating at hot conditions. However, this voltage level may be too high for devices having faster and improved PVT conditions, and as a result, extra power is wasted on heat. In data storage devices having batteries, such as mobile platforms, unnecessarily heating the device may result in the loss of battery power and battery life.

Therefore, there is a need in art for a storage system that can dynamically alter the working voltage level in response to changing PVT conditions.

SUMMARY

A data storage device includes a controller and a memory. The controller includes a host interface and a memory interface. The controller writes a first data test to a memory device through either the host interface or the memory interface at a first voltage level to determine a first write value. The controller reads the first data test written to the memory device through the same interface, either the host interface or the memory interface, at a second voltage level to determine a first read value. The controller then changes the second voltage to a third voltage based on a determination of whether the first read value is equal to the first write value to dynamically alter a working voltage level of the storage device in response to changing PVT conditions.

In one embodiment, a method for monitoring voltage impact of a read operation of a storage device comprises initializing a system of the storage device with a first voltage level. The storage device comprises a controller and one or more memory devices, and the controller comprises a host interface and a memory interface. The method further comprises writing, by the controller, a first data test to a first memory device of the one or more memory devices at a second voltage level through the host interface to determine a write value of the controller, and reading, by the controller, the first data test at a third voltage level through the host interface to determine a read value. The third voltage level is lower than the second voltage level. The method comprises determining whether the read value is equal to the write value, determining whether the third voltage level is the same as a predetermined minimum voltage level for the host interface if the read value equals the write value, and decreasing the third voltage level to a fourth voltage level supplied to the system if the third voltage level is not the same as the predetermined minimum voltage level to dynamically alter a working voltage level of the storage device in response to changing PVT conditions.

In another embodiment, a method for monitoring voltage impact of a write operation of a storage device comprises initializing a system of the storage device with a first voltage level. The storage device comprises a controller and one or more memory devices, and the controller comprises a memory interface and a host interface. The method further comprises writing, by the controller, a first data test to a first memory device of the one or more memory devices at a second voltage level through the memory interface to determine a write value, and reading, by the controller, the first data test at a third voltage level through the memory interface to determine a read value. The third voltage level is higher than the second voltage level. The method comprises determining whether the read value is equal to the write value, and increasing the third voltage level to a fourth voltage level supplied to the system if the read value is not equal the write value to dynamically alter a working voltage level of the storage device in response to changing PVT conditions.

In yet another embodiment, a data storage device comprises one or more memory devices, and a controller having a first interface and a second interface. The controller is configured to write a first data test to a first memory device of the one or more memory devices through the first interface of the controller at a first voltage level to determine a first write value. The controller is further configured to read the first data test written to the first memory device through the first interface at a second voltage level to determine a first read value. The controller is further configured to change the second voltage to a third voltage based on a determination of whether the first read value is equal to the first write value to dynamically alter a working voltage level of the storage device in response to changing PVT conditions.

In another embodiment, a data storage device comprises one or more memory devices, means for writing a first data test to a first memory device of the one or more memory devices through a first interface at a first voltage level to determine a first write value, means for reading the first data test written to the first memory device through the first interface at a second voltage level to determine a first read value, and means for comparing the first read value to the first write value, and dynamically altering a working voltage level of the system based on a determination of whether the first read value is equal to the first write value.

In another embodiment, a data storage system comprises a host device and a storage device coupled to the host device. The storage device includes a controller having a host interface coupled to the host device and a memory interface coupled to one or more memory devices. The controller is configured to write a first data test to a first memory device of the one or more memory devices through the host interface at a first voltage level to determine a write value, and to read the first data test written to the first memory device through the host interface at a second voltage level to determine a read value. The controller is further configured to compare the read value to the write value and to dynamically alter a working voltage level of the system based on a determination of whether the read value is equal to the write value.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

DETAILED DESCRIPTION

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

A data storage device includes a controller and a memory. The controller includes a host interface and a memory interface. The controller writes a first data test to a memory device through either the host interface or the memory interface at a first voltage level to determine a first write value. The controller reads the first data test written to the memory device through the same interface, either the host interface or the memory interface, at a second voltage level to determine a first read value. The controller then changes the second voltage to a third voltage based on a determination of whether the first read value is equal to the first write value to dynamically alter a working voltage level of the storage device in response to changing PVT conditions.

Figure 1:
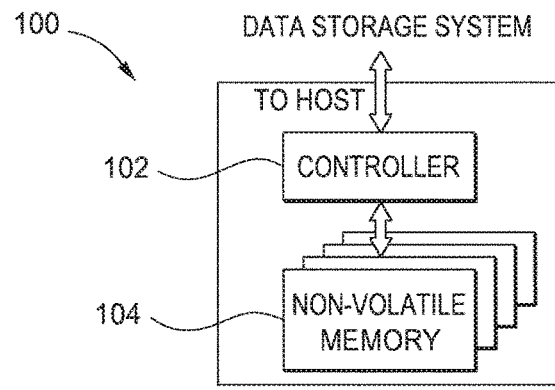
FIG. 1 is a block diagram of an illustrative example of a data storage system, according to one embodiment.
Figure 2:
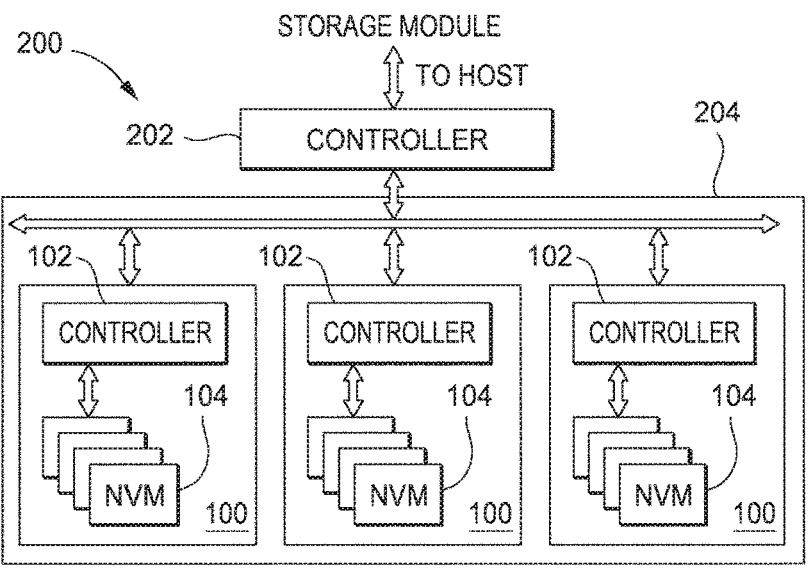
FIG. 2 is a block diagram of an illustrative example of a storage module that includes a plurality of data storage systems that each may include a controller, according to another embodiment.
Figure 3:
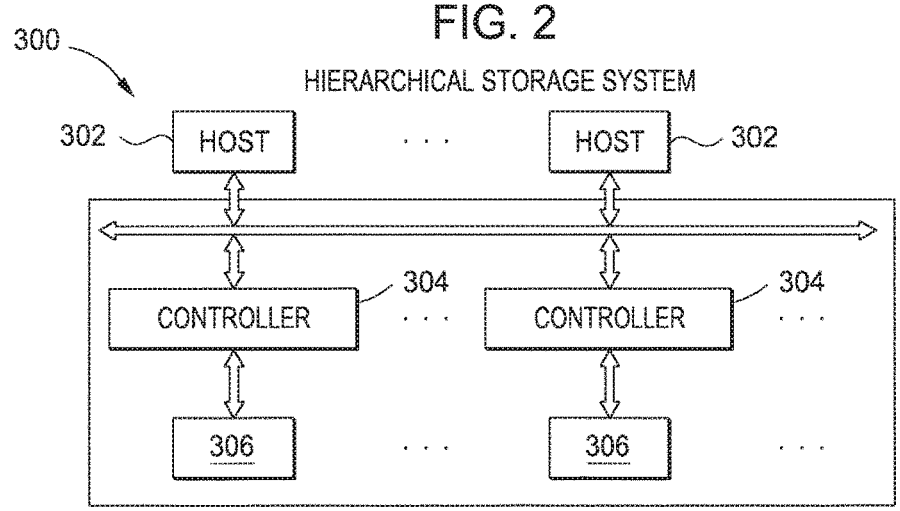
FIG. 3 is a block diagram of an illustrative example of a hierarchical data storage system that includes a plurality of controllers, according to another embodiment.

Memory systems suitable for use in implementing aspects of the disclosure are shown in FIGS. 1-3. FIG. 1 is a block diagram illustrating a data storage system 100 according to an example of the subject matter described herein. Referring to FIG. 1, the data storage system 100 includes a controller 102 and non-volatile memory that may be made up of one or more non-volatile memory die 104. As used herein, the term "memory die" refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash storage controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash storage controller is a device that manages data stored on flash memory and communicates with a host, such as a computer or electronic device. A flash storage controller can have various functionalities in addition to the specific functionality described herein. For example, the flash storage controller can format the flash memory, map out bad flash memory cells, and allocate spare cells to be substituted for future failed cells. Some part of the spare cells can be used to hold firmware to operate the flash storage controller and implement other features. In operation, when a host is to read data from or write data to the flash memory, the host communicates with the flash storage controller. If the host provides a logical address to which data is to be read/written, the flash storage controller can convert the logical address received from the host to a physical address in the flash memory. Alternatively, the host can provide the physical address. The flash storage controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, data storage system 100 may be a card based system, such as a secure digital (SD) or a micro secure digital (micro-SD) card. In an alternate embodiment, data storage system 100 may be part of an embedded memory system.

Although, in the example illustrated in FIG. 1, data storage system 100 includes a single channel between controller 102 and non-volatile memory die 104, the subject matter described herein is not limited to having a single memory channel. For example, in some NAND memory system architectures (such as the ones shown in FIGS. 2 and 3), 2, 4, 8 or more NAND channels may exist between the controller and the NAND memory device, depending on controller capabilities. In any of the embodiments described herein, more than a single channel may exist between the controller 102 and the non-volatile memory die 104, even if a single channel is shown in the drawings.

FIG. 2 illustrates a storage module 200 that includes a plurality of data storage systems 100. As such, storage module 200 may include a controller 202 that interfaces with a host and with storage system 204, which includes a plurality of data storage systems 100. The interface between controller 202 and data storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 3 is a block diagram illustrating a hierarchical storage system 300. A hierarchical storage system 300 includes a plurality of controllers 304, each of which controls a respective storage system 306. Controllers 304 may access memories within the hierarchical storage system 300 via a bus interface. In one embodiment, the bus interface may be an NVMe or fiber channel over Ethernet (FCoE) interface. In one embodiment, the hierarchical storage system 300 illustrated in FIG. 3 may be a rack mountable mass storage system that is accessible by multiple host computers 302, such as would be found in a data center or other location where mass storage is needed.

Figure 4:
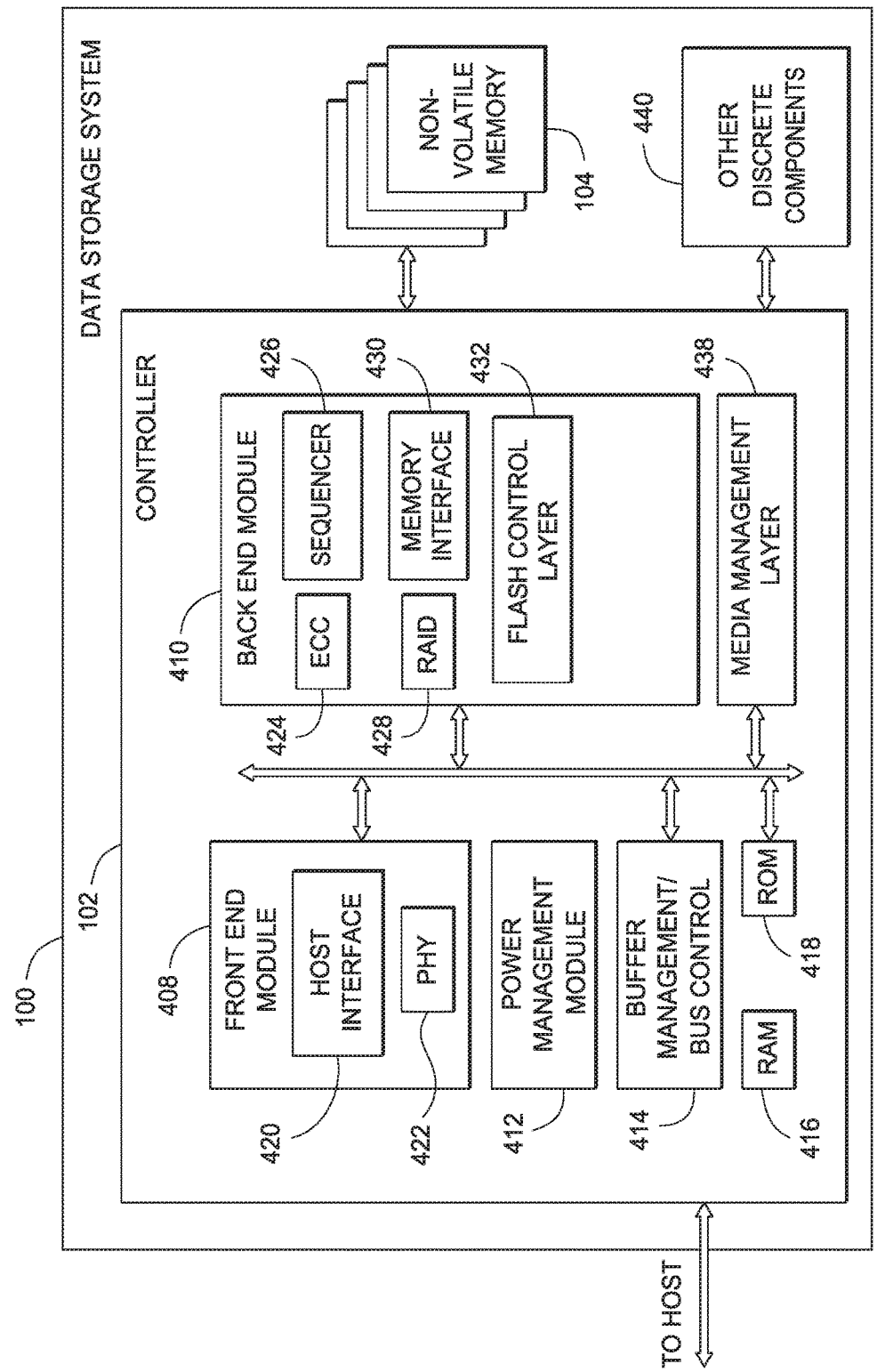
FIG. 4 is a block diagram illustrating an example of a controller, according to one embodiment.

FIG. 4 is a block diagram illustrating exemplary components of controller 102 in more detail. Controller 102 includes a front end module 408 that interfaces with a host, a back end module 410 that interfaces with the one or more non-volatile memory die 104, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 414 manages buffers in random access memory (RAM) 416 and controls the internal bus arbitration of the controller 102. A read only memory (ROM) 418 stores system boot code. Although illustrated in FIG. 4 as located within the controller 102, in other embodiments one or both of the RAM 416 and the ROM 418 may be located externally to the controller 102. In yet other embodiments, portions of RAM and ROM may be located both within the controller 102 and outside the controller 102.

Front end module 408 includes a host interface 420 and a physical layer interface (PHY) 422 that provide the electrical interface with the host or next level controller. The choice of the type of host interface 420 can depend on the type of memory being used. Examples of host interfaces 420 include, but are not limited to, SATA, SATA Express, SAS, Fibre Channel, USB, PCIe, and NVMe. The host interface 120 typically facilitates transfer for data, control signals, and timing signals.

Back end module 410 includes an error correction code (ECC) engine 424 that encodes the data received from the host, and decodes and error corrects the data read from the non-volatile memory. A command sequencer 426 generates command sequences, such as program and erase command sequences, to be transmitted to non-volatile memory die 104. A RAID (Redundant Array of Independent Drives) module 428 manages generation of RAID parity and recovery of failed data. The RAID parity may be used as an additional level of integrity protection for the data being written into the non-volatile memory die 104. In some cases, the RAID module 428 may be a part of the ECC engine 424. A memory interface 430 provides the command sequences to non-volatile memory die 104 and receives status information from non-volatile memory die 104. For example, the memory interface 430 may be a double data rate (DDR) interface, such as a Toggle Mode 200, 400, or 800 interface. A flash control layer 432 controls the overall operation of back end module 410.

Additional components of data storage system 100 illustrated in FIG. 4 include a power management module 412 and a media management layer 438, which performs wear leveling of memory cells of non-volatile memory die 104. Data storage system 100 also includes other discrete components 440, such as external electrical interfaces, external RAM, resistors, capacitors, or other components that may interface with controller 102. In alternative embodiments, one or more of the physical layer interface 422, RAID module 128, media management layer 138 and buffer management/bus controller 114 are optional components that are omitted from the controller 102.

Figure 5:
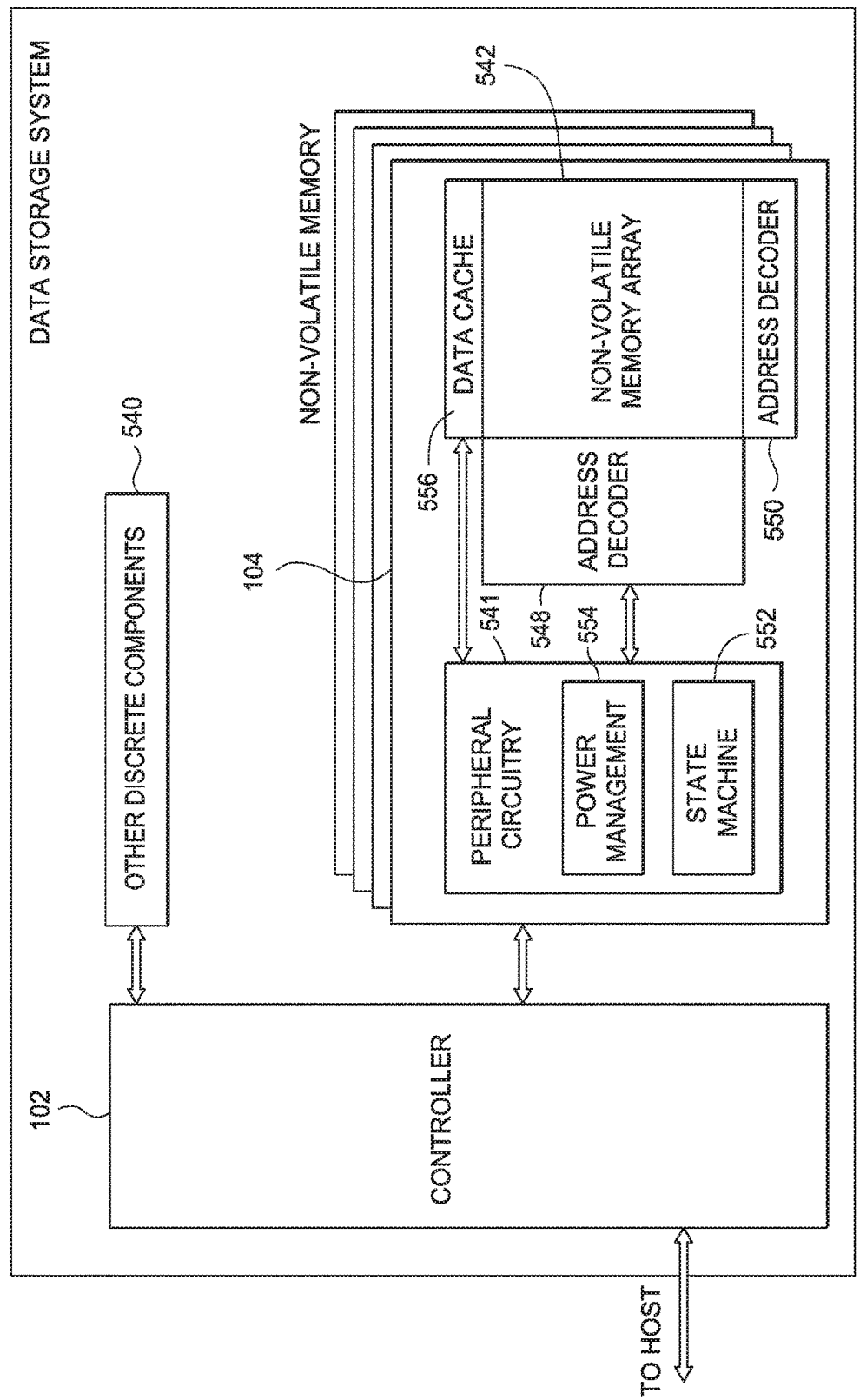
FIG. 5 is a block diagram illustrating exemplary components of a non-volatile memory die that may be coupled to a controller, according to one embodiment.

FIG. 5 is a block diagram illustrating exemplary components of non-volatile memory die 104 in more detail. Non-volatile memory die 104 includes peripheral circuitry 541 and non-volatile memory array 542. Non-volatile memory array 542 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 541 includes a state machine 552 that provides status information to controller 102. The peripheral circuitry 541 also includes a power management or data latch control module 554. Non-volatile memory die 104 further includes discrete components 540, an address decoder 548, an address decoder 550, and a data cache 556 that caches data.

Figure 6:
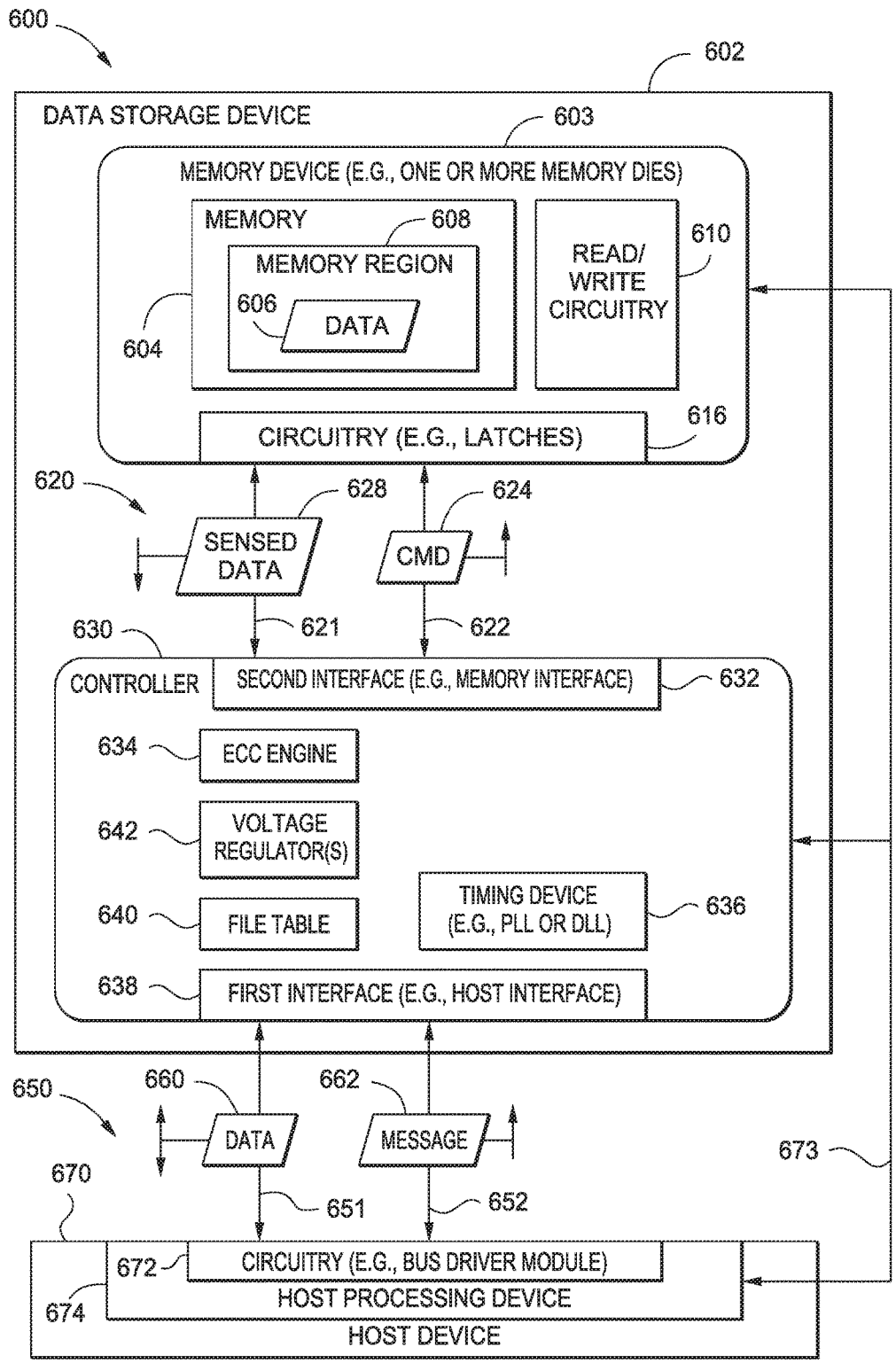
FIG. 6 is a block diagram of a particular illustrative example of a data storage system including a data storage device, according to one embodiment.

FIG. 6 depicts an illustrative example of a data storage system 600. The data storage system 600 includes a data storage device 602 (e.g., the data storage system 100) and a host device 670 (e.g., the host 302).

The data storage device 602 includes a memory device, such as a memory device 603. The memory device 603 may include one or more memory dies (e.g., one memory die, two memory dies, eight memory dies, or another number of memory dies). To further illustrate, the memory device 603 may include the non-volatile memory die 104. The memory device 603 includes a memory 604, such as a non-volatile memory of storage elements included in a memory die of the memory device 603. For example, the memory 604 may include a flash memory, such as a NAND flash memory, or a resistive memory, such as a resistive random access memory (ReRAM), as illustrative examples. The memory 604 may have a three-dimensional (3D) memory configuration. As an example, the memory 604 may have a 3D vertical bit line (VBL) configuration. In a particular implementation, the memory 604 is a non-volatile memory having a 3D memory configuration that is monolithically formed in one or more physical levels of arrays of memory cells having an active area disposed above a silicon substrate. Alternatively, the memory 604 may have another configuration, such as a two-dimensional (2D) memory configuration or a non-monolithic 3D memory configuration (e.g., a stacked die 3D memory configuration).

The memory 604 may include one or more regions of storage elements (also referred to herein as memory cells), such as a memory region 608. An example of a memory region is a block, such as a NAND flash erase group of memory elements. Another example of a memory region 608 is a word line of memory elements. A word line may function as a single-level-cell (SLC) word line or as a multi-level-cell (MLC) word line (such as a three-bit-per-cell word line or a two-bit-per-cell word line, as illustrative examples). Each memory element of the memory 604 may be programmable to a state (e.g., a threshold voltage in a flash configuration or a resistive state in a resistive memory configuration) that indicates one or more bit values.

The memory device 603 further includes read/write circuitry 610. The read/write circuitry 610 is configured to program values to storage elements of the memory 604 and to sense values from memory elements of the memory 604. The memory device 603 may further include circuitry 616 (e.g., one or more data latches, one or more control latches, or a combination thereof).

The data storage device 602 further includes a controller 630, such as controller 102 of FIG. 1 and FIG. 4. The controller 630 includes a first interface 638 (e.g., a host interface), an error correction code (ECC) engine 634, a timing device 636, a second interface 632 (e.g., a memory interface), and one or more voltage regulators 642. For example, the ECC engine 634 may correspond to the ECC engine 424, the first interface 638 may correspond to the host interface 420, and the second interface 632 may correspond to the memory interface 430. To further illustrate, the first interface 638 may include one or more latches to receive data and commands from the host device 670, and the second interface 632 may include one or more bus drivers to send data and commands to the circuitry 616 of the memory device 603. The controller 630 may store (or access) a file table 640, such as a file allocation table (FAT).

The host device 670 includes circuitry 672. For example, the circuitry 672 may include one or more bus drivers. The circuitry 672 may be integrated within or coupled to a processor or controller of the host device 670, such as within a host processing device 674 (e.g., an application processor).

The data storage device 602 and the host processing device 674 are coupled via a connection 650 (e.g., a bus). For example, FIG. 6 illustrates that the connection 650 includes one or more data lines 651 and one or more control lines 652. The connection 650 is coupled to the first interface 638 and to the circuitry 672. In some implementations, the connection 650 may include or may be coupled to the physical layer interface 422 of FIG. 4.

The memory device 603 and the controller 630 are coupled via a connection 620 (e.g., a bus). For example, FIG. 6 illustrates that the connection 620 may include one or more data lines 621, one or more control lines 622. The connection 620 is coupled to the circuitry 616 and to the second interface 632.

In an illustrative implementation, the data storage system 600 further includes a power supply connection 673 (e.g., a "rail" to provide a power supply voltage, such as VDD, VCC, or both). The power supply connection 673 may be coupled to the memory device 603, the controller 630, and the host processing device 674. Depending on the particular implementation, the power supply connection 673 may be supplied by a battery (e.g., a mobile device battery) or by a power supply device (e.g., a transformer) coupled to a main power supply. In other implementations, the memory device 603, the controller 630, and/or the host processing device 674 are connected to separate power supply connections.

During operation, the controller 630 is configured to receive data and instructions from the host device 670 using the first interface 638. For example, the controller 630 may receive data 660 from the host device 670 via the first interface 638. To further illustrate, the data 660 may be received via the one or more data lines 651 in connection with a request for write access sent via the one or more control lines 652. The controller 630 may also be configured to receive instructions or messages 662 from the host device 670 via the one or more control lines 652.

The ECC engine 634 may be configured to receive the data 660 and to generate one or more ECC codewords based on the data 660. The ECC engine 634 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The controller 630 is configured to send data and commands to the memory device 603 using the second interface 632 and to receive data from the memory device 603 using the second interface 632. For example, the controller 630 is configured to send data (e.g., one or more ECC codewords generated by the ECC engine 634) and a write command (e.g., a command 624) to cause the memory device 603 to store the data to a specified address of the memory 604. The write command may specify a physical address of a portion of the memory 604 that is to store the data. To further illustrate, the controller 630 may send the data to the memory device 603 via the one or more data lines 621 in connection with a write command sent via the one or more control lines 622. After the memory device 603 writes data in response to a received command, a write value of the controller 630 may be determined.

In one embodiment, in response to receiving a message 662, the controller 630 may cause the second interface 632 to send data 606 and a write command (e.g., the command 624) to the circuitry 616 using the connection 620. The write command may specify one or more physical addresses of the memory 604, such as a physical address of the memory region 608. Upon receiving the data 606 at the circuitry 616, the memory device 603 may cause the read/write circuitry 610 to program the data 606 to the memory 604. In response to programming the data 606 to the memory 604, the memory device 603 may send a status indication to the controller 630 indicating a status of the write operation (e.g., a pass or fail status), along with a write value.

The controller 630 is configured to send a read command (e.g., the command 624) to the memory device 603 to access data from a specified address of the memory 604. For example, the controller 630 may send the read command to the memory device 603 in response to receiving a request for read access from the host device 670. The read command may specify the physical address of a portion of the memory 604. For example, the read command may specify the physical address of a portion of the memory 604 storing the data. In response to the read command, the memory device 603 may cause the read/write circuitry 610 to sense the portion of the memory 604 storing the data to generate sensed data 628 (e.g., a representation of the data that may differ with respect to the data due to one or more bit errors). Additionally, a read value of the controller 630 may be determined after the controller 630 sends the read command to the memory device 603.

For example, the controller 630 may send a read command (e.g., the command 624) to the memory device 603 using the connection 620. The read command may specify the physical address of the memory region 608. The memory device 603 may cause the read/write circuitry 610 to sense the memory region 608 to generate sensed data 628. The memory device 603 may provide the sensed data 628 to the controller 630 using the connection 620, and the controller 630 may receive the sensed data 628 using the second interface 632.

The controller 630 is configured to receive the sensed data 628 from the memory device 603 via the second interface 632. The controller 630 may input the sensed data 628 to the ECC engine 634 to initiate a decoding process to correct one or more bit errors in the sensed data (if any) up to a particular error correction capability of the particular ECC technique. In response to decoding the sensed data 628, the ECC engine 634 may output the data 660. The controller 630 may provide the data 660 to the host device 670 using the first interface 638.

The controller 630 is further configured to monitor the voltage impact of the data storage device 602 during read and write operations, which allows the controller 630 to monitor the speed of the data storage device 602, operating temperature, and power usage. The controller 630 monitors the voltage impact through the first interface 638, or the host interface, to monitor the voltage impact of a read operation of the data storage device 602 (i.e., checking the voltage impact from the controller 630). The controller 630 also monitors the voltage impact through the second interface 632, or the memory interface, to monitor the voltage impact of a write operation (i.e., checking the voltage impact from the memory device 603). In response to monitoring the voltage through the host interface and the memory interface, the controller 630 alters the working voltage level during operations of the data storage device 602 to reduce the power consumption. Thus, the working voltage level of the storage device 602 is adjusted, in real time, to meet the current requirements of the storage system 600.

To monitor the voltage impact of the read operation through the host interface 638, the controller 630 may write a data test to the memory device 603 at a high host interface voltage level to determine a write value. The controller 630 may then read the data test from the memory device 603 at a low host interface voltage level to determine a read value. The controller 630 may then compare the write value to the read value to see if the write value and read value are the same.

To monitor the voltage impact of the write operation through the memory interface 632, the controller 630 may write a data test to the memory device 603 at a low memory interface voltage level to determine a write value. The controller 630 may then read the data test from the memory device 603 at a high memory interface voltage level to determine a read value. The controller 630 may then compare the write value to the read value to see if the write value and read value are the same.

The controller 630 is further configured to alter a working voltage level of the data storage device 602 in response to the comparison of the write value to the read value. In one embodiment, the voltage regulators 642 of the controller 630 are configured to alter the working voltage level of the data storage device 602. The write value equaling the read value of the controller 630 may indicate that data storage device 602 currently has satisfactory setup/hold margins, and that the data storage device 602 is presently operating at an optimal working voltage level. Thus, the read value being equal to the write value may indicate that the power consumption of the data storage system 600 is being optimized.

Even if the controller 630 determines that read value is equal to the write value, the controller 630 may determine that the working voltage level is not optimized. In one embodiment, the controller 630 is configured to compare the working voltage level of the data storage device 602 to a predetermined minimum voltage level. If the working voltage level is not equal to the predetermined minimum voltage level, the controller 630 may alter the working voltage level to optimize the power consumption of the data storage system 600.

The write value not being equal to the read value may indicate there is a risk of a setup/hold violation occurring, and that the setup/hold margins are unsatisfactory. The write value not being equal to the read value may cause excess power to be generated, causing the data storage system 600 to unnecessarily waste heat. Thus, if the write value does not equal the read value, the controller 630 may alter the working voltage level of data storage device 602 to minimize power consumption. The working voltage level optimization, or minimization, may be done "on the fly" using an interrupt mechanism or a timer trigger by utilizing one of the storage device vendor specific function lines to be implemented for both high limit and low limit level operations. By altering the working voltage level of the data storage device 602 "on the fly", the power consumption of the data storage device 602 may be reduced to avoid generating excess power and heat.

Figure 7A:
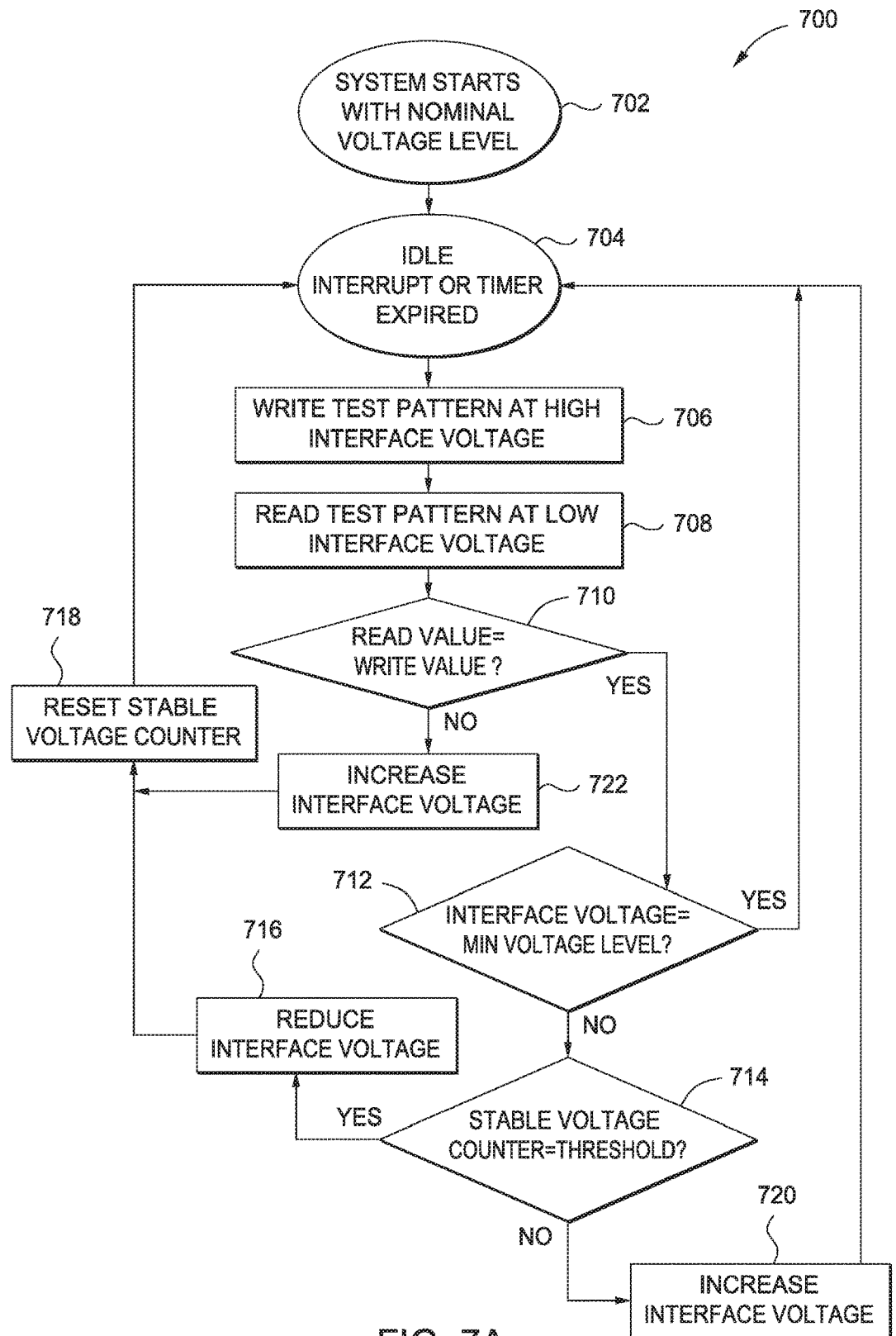
FIGS. 7A-7B illustrate methods for monitoring the voltage impact of read and write operations of a storage system, according to one embodiment To facilitate understanding, identical reference numerals have been used, where possible, to designate identical elements that are common to the figures. It is contemplated that elements and features of one embodiment may be beneficially incorporated in other embodiments without further recitation.
Figure 7B:
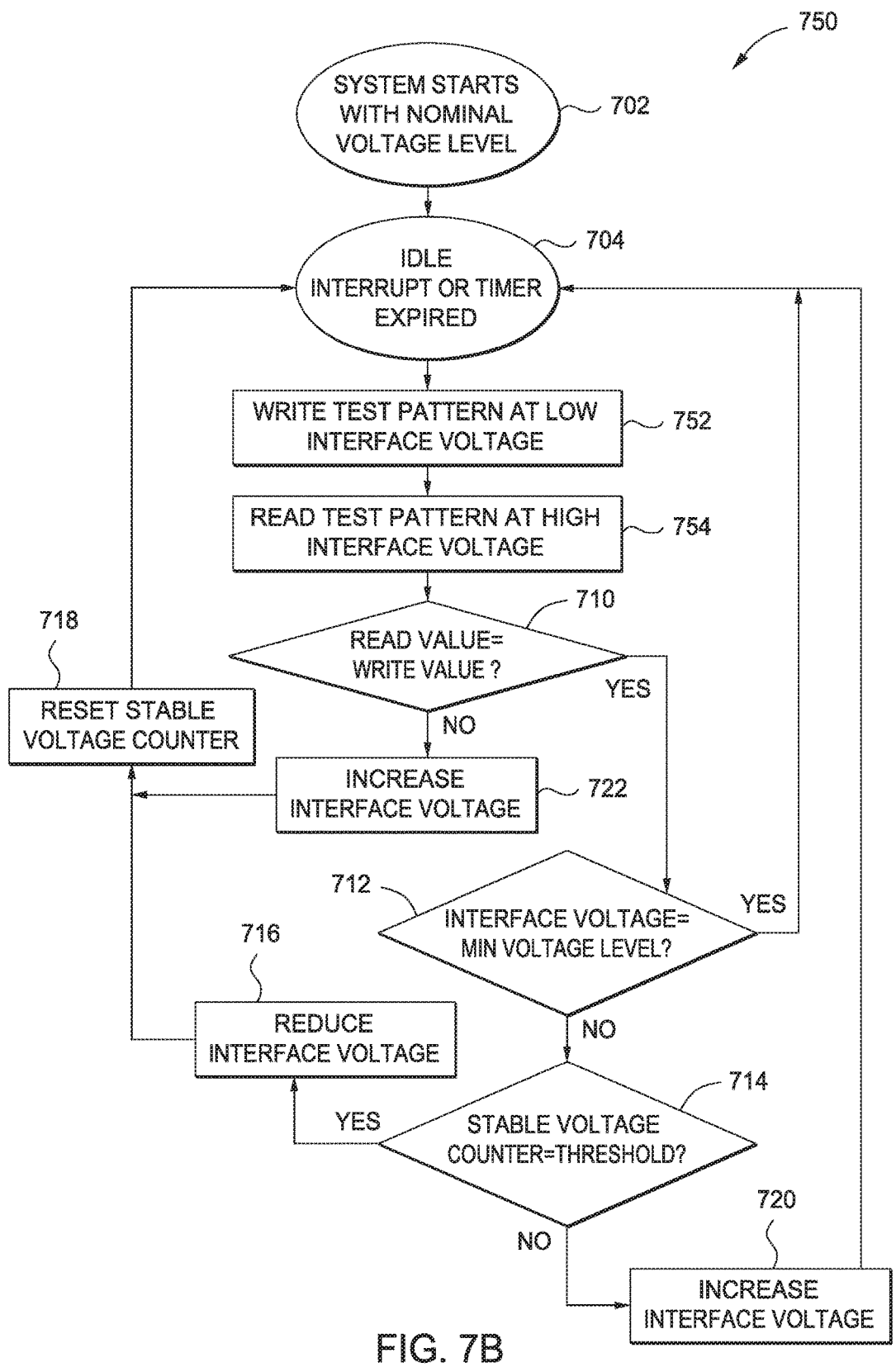

FIGS. 7A-7B illustrate methods 700 and 750, respectively, for monitoring the voltage impact of read and write operations of a storage system, according to one embodiment. The storage system may be data storage system 100 of FIG. 1, data storage system 300 of FIG. 3, or data storage system 600 of FIG. 6. The data storage system may comprise a host device and storage device, such as data storage device 602 and host device 670 of FIG. 6. The storage device may comprise a controller and one or more memory devices, such as controller 630 and memory device 603 of FIG. 6, or controller 102 of FIG. 1 and FIG. 4. The controller may comprise a host interface and a memory interface, such as host interface 638 and memory interface 632 of FIG. 6, or host interface 420 and memory interface 430 of FIG. 4.

FIG. 7A illustrates a flowchart of method 700, which monitors the voltage impact of a read operation to determine whether the controller is operating at an optimal working voltage level for the host interface working frequency. FIG. 7B illustrates a flowchart of method 750, which monitors the voltage impact of a write operation to determine whether the controller is operating at the optimal working voltage level for the memory interface working frequency. Operation 702, operation 704, operation 710, operation 712, operation 714, operation 716, operation 718, operation 720, and operation 722 are the same for both method 700 and method 750.

In operation 702, the system of the storage device is initialized with a first voltage level. The first voltage level may be a nominal voltage level. In operation 704, the system is prompted to monitor the voltage impact during a defined interval time using a timer trigger or during an idle time associated with the data storage device (e.g., if the host device is not requesting read access or write access) using an interrupt mechanism. If the system of the storage device is already operating, the methods 700 and 750 may start from operation 704.

In operation 706 of method 700, the controller writes a data test to a first memory device at a second voltage level through the host interface to determine a write value of the controller. The second voltage level may be higher than the first voltage level. In operation 706 of method 700, the controller may be writing to the memory at an approved high voltage level. In operation 708 of method 700, the controller reads the data test at a third voltage level through the host interface to determine a read value of the controller. In method 700, the third voltage level may be lower than the second voltage level. In one embodiment of method 700, the second voltage level is a high limit of the working voltage level, and the third voltage is a low limit of the working voltage level.

In operation 752 of method 750, the controller writes the data test to the first memory device at the second voltage level through the memory interface to determine a write value of the controller. The second voltage level may be higher than the first voltage level. In operation 754 of method 750, the controller reads the data test at the third voltage level through the memory interface to determine the read value of the controller. In method 750, the third voltage level may be higher than the second voltage level. In one embodiment of method 750, the second voltage level is a low limit of the working voltage level, and the third voltage is a high limit of the working voltage level. As such, in operation of 754 of method 750, the controller may be reading from the memory at an approved high voltage level.

In operation 710 of both method 700 and method 750, the controller determines whether the read value is equal to the write value. If the read value is equal to the write value, method 700 and method 750 proceed to operation 712. If the read value is not equal to the write value, method 700 and method 750 proceed to operation 722. The read value not being equal to the write value indicates that there is a risk of a setup/hold violation occurring, and that the setup/hold margins are unsatisfactory. Thus, in operation 722, the controller increases the third voltage level to a fourth voltage level to reduce the risk of a setup/hold violation.

In operation 712 of both method 700 and method 750, if the controller determines that the read value is equal to the write value, the controller then determines whether the third voltage level is the same as a predetermined minimum voltage level. In one embodiment, the predetermined minimum voltage level is based on a setup and hold time required by the read operation or by the write operation. The predetermined minimum voltage level may be based on at least one of a change in operating voltage, operating temperature, or load of the host interface or memory interface. The predetermined minimum voltage level may include the lowest host interface voltage level the system may operate at during read operations while still maintaining satisfactory setup/hold margins, and the lowest memory interface voltage level the system may operate at during write operations while still maintaining satisfactory setup/hold margins.

The controller determining that the third voltage level is the same as the predetermined minimum voltage level in operation 712 may indicate that the system is operating at optimal power consumption, and the working voltage level need not be altered. If the controller makes such a determination, the respective method, method 700 or method 750, is repeated one or more times starting from operation 704 to ensure the third voltage level remains the optimal working voltage level for the system in response to changing PVT conditions. In one embodiment, methods 700 and 750 may alternate back and forth in operation. For example, once method 700 completes operation 712, the system will start method 750 instead of restarting method 700.

If the controller determines that the third voltage level is not the same as the predetermined minimum voltage level in operation 712, methods 700 and 750 each proceed to operation 714. In operation 714, the controller provisionally lowers the third voltage level to a fifth voltage level and cycles through the respective method, method 700 or method 750, starting from operation 704, a predetermined number of times using the fifth voltage level to read the data test instead of the third voltage level. Operation 714 tests and determines whether the fifth voltage level is a stable working voltage level for operating the system. The controller counts each successful cycle where the fifth voltage level was determined to be a stable working voltage level and determines a stable voltage count. When the stable voltage count reaches a predetermined threshold, the methods 700 and 750 proceed to operation 716.

In operation 716, if the stable voltage count reaches the predetermined threshold, the controller maintains the reduction to the fifth voltage level such that the fifth voltage level becomes the updated optimized working voltage level of the storage device. In one embodiment, the fifth voltage level may be to equal or greater than the predetermined minimum voltage level. Thus, the working voltage level of the host interface or memory interface is dynamically lowered upon the determination that the fifth voltage level is a stable working voltage level. Accordingly, the working voltage level is adjusted "on the fly", or in real time during operations, in response to the changing PVT conditions. The working voltage level adapting as the PVT conditions change during system operations results in a reduction and optimization of power consumption.

Once the working voltage level is set to equal the fifth working voltage level in operation 716, the stable voltage count is reset and cleared from the controller in operation 718. Additionally, once the third voltage level is increased to the fourth voltage level in operation 722, method 700 and method 750 proceed to operation 718, and the stable voltage count is reset. Method 700 may then start again from operation 704 to monitor the voltage impact of read operations of the system, as the PVT conditions may be constantly changing, or method 750 may begin. Similarly, method 750 may start again from operation 704 to monitor the voltage impact of write operations of the system, or method 700 may begin. By repeating the methods 700 and 750, the working voltage level may be gradually lowered to the lowest limit, or to just above a fail voltage level. The fail voltage level may be the first voltage level that results in a setup/hold violation, or that causes the system to fail to operate. The fail voltage level may be less than the predetermined minimum voltage level. The fail voltage level is dynamic, and may change with the changing PVT conditions.

If, during operation 714, the stable voltage count fails to reach the predetermined threshold, the methods 700 and 750 instead proceed to operation 720. The stable voltage count failing to meet the predetermine threshold may indicate that the fifth voltage level is unstable, and thus, too low to function as the working voltage level of the system. The stable voltage count failing to meet the predetermined threshold may indicate that the fifth voltage level is equal to or less than the fail voltage level, and may indicate that there is a risk of a setup/hold violation occurring. Thus, in operation 720, the fifth voltage level is increased. In one embodiment, the fifth voltage level is increased back to the third voltage level. In another embodiment, the fifth voltage level may be increased to a sixth voltage level. The sixth voltage level may be less than the third voltage level, but greater than the predetermined minimum voltage level.

Increasing the fifth voltage level allows for the device to continue write and read operations despite poor PVT conditions. Following operation 720, method 700 may restart again from operation 704 to monitor the voltage impact of read operations of the system, or method 750 may restart again from operation 704 to monitor the voltage impact of write operations of the system. By restarting method 700 or method 750, the working voltage level of the system may be updated and adjusted in accordance with the changing PVT conditions of the system. Thus, if the poor PVT conditions of the storage device improve, the working voltage level of the storage device may be lowered and optimized directly in response. Instead of maintaining the higher voltage level, the storage device can monitor the voltage impact and once again reduce the working voltage level to conserve power and prevent wasted heat when the PVT conditions improve. Continuous monitoring of the voltage impact allows for the working voltage level to be adapted, in real time, to meet the current requirements of the storage system.

In one embodiment, the methods 700 and 750 alternate back and forth in operation. For example, once method 700 completes operation 712, operation 718, or operation 720, the system will start method 750 instead of restarting method 700. Once method 750 completes operation 712, operation 718, or operation 720, the system may then re-start operation 700. Thus, the system may alternate writing and reading the data test through the host interface and writing and reading the data test through the memory interface to constantly monitor the voltage impact during read and write operations. In one embodiment, the system continuously alternates back and forth between method 700 and method 750 to monitor the voltage interface while the device is operating.

By monitoring the voltage impact of read and write operations of a storage system, the working voltage level of the system is dynamically altered "on the fly" directly in response to changing PVT conditions. The system is able to conserve power by operating at reduced voltage levels when feasible, reducing the overall power consumption and preventing wasted heat. Additionally, monitoring the voltage impact at the host interface and at the memory interface allows for the speed of the device, operating temperature, and power usage to be monitored.

By altering the working voltage in real time during operations, the system is adjusted to consistently operate at optimal power consumption and performance of the storage device at maximum system frequency is improved. Continuous monitoring of the voltage impact allows for the working voltage level to b adapted, in real time, to meet the current requirements of the storage system. Moreover, monitoring the voltage impact and dynamically altering the working voltage level in response also results in increased battery life and battery power for storage devices operating with a battery, such as mobile platforms, as the storage device is no longer generating wasted heat, causing the device to heat unnecessarily.

In one embodiment, a method for monitoring voltage impact of a read operation of a storage device comprises initializing a system of the storage device with a first voltage level. The storage device comprises a controller and one or more memory devices, and the controller comprises a host interface and a memory interface. The method further comprises writing, by the controller, a first data test to a first memory device of the one or more memory device at a second voltage level through the host interface to determine a write value of the controller, and reading, by the controller, the first data test at a third voltage level through the host interface to determine a read value. The third voltage level is lower than the second voltage level. The method comprises determining whether the read value is equal to the write value, determining whether the third voltage level is the same as a predetermined minimum voltage level for the host interface if the read value equals the write value, and decreasing the third voltage level to a fourth voltage level supplied to the system if the third voltage level is not the same as the predetermined minimum voltage level to dynamically alter a working voltage level of the storage device in response to changing PVT conditions.

The writing of the first data test may occur during a defined interval timeframe. The read value being equal to the write value may indicate that the system can be operated at the fourth voltage level, the fourth voltage level being lower than the second voltage level. The fourth voltage level may be equal to or greater than the predetermined minimum voltage level. The method may further comprise increasing the third voltage level to a fifth voltage level supplied to the system if the read value is not equal to the write value. The fifth voltage may be the altered working voltage of the system. The fifth voltage level may be equal to or greater than the predetermined minimum voltage level. The third voltage level may remain unaltered if the third voltage is the same as the predetermined minimum voltage level.

The method may further comprise repeating: writing, by the controller, a first data test to a first memory device of the one or more memory device at a second voltage level through the host interface to determine a write value of the controller, reading, by the controller, the first data test at a third voltage level through the host interface to determine a read value, wherein the third voltage level is lower than the second voltage level, determining whether the read value is equal to the write value, determining whether the third voltage level is the same as a predetermined minimum voltage level of the system if the read value equals the write value, and decreasing the third voltage level to a fourth voltage level supplied to the system if the third voltage level is not the same as the predetermined minimum voltage level for the host interface to gradually lower the fourth voltage level.

In another embodiment, a method for monitoring voltage impact of a write operation of a storage device comprises initializing a system of the storage device with a first voltage level. The storage device comprises a controller and one or more memory devices, and the controller comprises a memory interface and a host interface. The method further comprises writing, by the controller, a first data test to a first memory device of the one or more memory devices at a second voltage level through the memory interface to determine a write value, and reading, by the controller, the first data test at a third voltage level through the memory interface to determine a read value. The third voltage level is higher than the second voltage level. The method comprises determining whether the read value is equal to the write value, and increasing the third voltage level to a fourth voltage level supplied to the system if the read value is not equal the write value to dynamically alter a working voltage level of the storage device in response to changing PVT conditions.

The writing of the first data test may occur during idle interrupt of the system. The read value not being equal to the write value may indicate a risk of a setup/hold violation of the system. The fourth voltage level may be the altered working voltage level. The first voltage level may be a nominal voltage level. The method may further comprise decreasing the third voltage level to a fifth voltage level supplied to the system if the read value is equal to the write value.

In yet another embodiment, a data storage device comprises one or more memory devices, and a controller having a first interface and a second interface. The controller is configured to write a first data test to a first memory device of the one or more memory devices through the first interface of the controller at a first voltage level to determine a first write value. The controller is further configured to read the first data test written to the first memory device through the first interface at a second voltage level to determine a first read value. The controller is further configured to change the second voltage to a third voltage based on a determination of whether the first read value is equal to the first write value to dynamically alter a working voltage level of the storage device in response to changing PVT conditions.

The third voltage level may be lower than the second voltage level if the controller determines the first read value is equal to the first write value. The third voltage level may be higher than the second voltage if the controller determines the first read value is not equal to the first write value. The first interface may be a host interface and the second interface may be a memory interface, and the first voltage level may be higher than the second voltage level. The controller may be further configured to write a second data test to the first memory device through the second interface at a fifth voltage level to determine a second write value, to read the second data test written to the first memory device through the second interface at a sixth voltage level to determine a second read value, and to change the sixth voltage to a seventh voltage based on a determination of whether the second read value is equal to the second write value, wherein the seventh voltage is the altered working voltage, and wherein the first interface may be a host interface and the second interface may be a memory interface. The controller may be further configured to alternate writing and reading the first data test through the first interface and the second data test through the second interface.

In another embodiment, a data storage device comprises one or more memory devices, means for writing a first data test to a first memory device of the one or more memory devices through a first interface at a first voltage level to determine a first write value, means for reading the first data test written to the first memory device through the first interface at a second voltage level to determine a first read value, and means for comparing the first read value to the first write value, and dynamically altering a working voltage level of the system based on a determination of whether the first read value is equal to the first write value. The altered working voltage level may be equal to or greater than a predetermined minimum voltage level of the system.

In another embodiment, a data storage system comprises a host device and a storage device coupled to the host device. The storage device includes a controller having a host interface coupled to the host device and a memory interface coupled to one or more memory devices. The controller is configured to write a first data test to a first memory device of the one or more memory devices through the host interface at a first voltage level to determine a write value, and to read the first data test written to the first memory device through the host interface at a second voltage level to determine a read value. The controller is further configured to compare the read value to the write value and to dynamically alter a working voltage level of the system based on a determination of whether the read value is equal to the write value. The working voltage level may be lower than the first voltage level.

The above described methods of operation provide for improved data storage devices. Specifically, the methods allow the working voltage level of storage devices to be dynamically altered "on the fly" in response to changing PVT conditions by monitoring the voltage impact of read and write operations. Dynamically altering the working voltage level of the storage device in real time results in power consumption being reduced and optimized such that heat is no longer wasted, and battery life is increased.

While the foregoing is directed to implementations of the present disclosure, other and further implementations of the disclosure may be devised without departing from the basic scope thereof, and the scope thereof is determined by the claims that follow.

What is claimed is:

1. A method for monitoring voltage impact of a read operation of a storage device, comprising:
   initializing a system of the storage device with a first voltage level, wherein the storage device comprises a controller and one or more memory devices, and wherein the controller comprises a host interface and a memory interface;
   writing, by the controller, a first data test to a first memory device of the one or more memory devices at a second voltage level through the host interface, wherein the second voltage level is a write value of the controller;
   reading, by the controller, the first data test at a third voltage level through the host interface, wherein the third voltage level is a read value, and wherein the third voltage level is lower than the second voltage level;
   determining whether the read value is equal to the write value;
   determining whether the third voltage level is the same as a predetermined minimum voltage level for the host interface if the read value equals the write value; and decreasing the third voltage level to a fourth voltage level supplied to the system if the third voltage level is not the same as the predetermined minimum voltage level to dynamically alter a working voltage level of the storage device in response to changing process, voltage, and temperature conditions.

2. The method of claim 1, wherein the writing of the first data test occurs during a defined interval timeframe.

3. The method of claim 1, wherein the read value being equal to the write value indicates the system can be operated at the fourth voltage level, the fourth voltage level being lower than the second voltage level.

4. The method of claim 3, further comprising:
repeating:
writing, by the controller, the first data test to the first memory device of the one or more memory device at the second voltage level through the host interface, wherein the second voltage level is the write value of the controller;
reading, by the controller, the first data test at the third voltage level through the host interface, wherein the third voltage level is the read value, and wherein the third voltage level is lower than the second voltage level;
determining whether the read value is equal to the write value;
determining whether the third voltage level is the same as a predetermined minimum voltage level of the system if the read value equals the write value; and
decreasing the third voltage level to a fourth voltage level supplied to the system if the third voltage level is not the same as the predetermined minimum voltage level for the host interface to gradually lower the fourth voltage level.

5. The method of claim 4, wherein the fourth voltage level is equal to or greater than the predetermined minimum voltage level.

6. The method of claim 1, further comprising: increasing the third voltage level to a fifth voltage level supplied to the system if the read value is not equal to the write value.

7. The method of claim 6, wherein the fifth voltage level is the altered working voltage level of the system.

8. The method of claim 7, wherein the fifth voltage level is equal to or greater than the predetermined minimum voltage level.

9. The method of claim 1, wherein the third voltage level remains unaltered if the third voltage level is the same as the predetermined minimum voltage level.

10. A method for monitoring voltage impact of a write operation of a storage device, comprising:
initializing a system of the storage device with a first voltage level, wherein the storage device comprises a controller and one or more memory devices, and wherein the controller comprises a memory interface and a host interface;
writing, by the controller, a first data test to a first memory device of the one or more memory devices at a second voltage level through the memory interface, wherein the second voltage level is a write value;
reading, by the controller, the first data test at a third voltage level through the memory interface, wherein the third voltage level is a read value, and wherein the third voltage level is higher than the second voltage level;
determining whether the read value is equal to the write value; and increasing the third voltage level to a fourth voltage level supplied to the system if the read value is not equal the write value to dynamically alter a working voltage level of the storage device in response to changing process, voltage, and temperature conditions.

11. The method of claim 10, wherein the writing of the first data test occurs during idle interrupt of the system.

12. The method of claim 10, wherein the read value not being equal to the write value indicates a risk of a setup/hold violation of the system.

13. The method of claim 10, wherein the fourth voltage level is the altered working voltage level.

14. The method of claim 10, wherein the first voltage level is a nominal voltage level.

15. The method of claim 10, further comprising: decreasing the third voltage level to a fifth voltage level supplied to the system if the read value is equal to the write value.

16. A data storage device, comprising:
one or more memory devices; and
a controller having a first interface and a second interface, the controller configured to write a first data test to a first memory device of the one or more memory devices through the first interface of the controller at a first voltage level, wherein the first voltage level is a first write value; the controller further configured to read the first data test written to the first memory device through the first interface at a second voltage level, wherein the second voltage level is a first read value; and the controller further configured to change the second voltage level to a third voltage level based on a determination of whether the first read value is equal to the first write value to dynamically alter a working voltage level of the storage device in response to changing process, voltage, and temperature conditions.

17. The data storage device of claim 16, wherein the third voltage level is lower than the second voltage level if the controller determines the first read value is equal to the first write value.

18. The data storage device of claim 16, wherein the third voltage level is higher than the second voltage level if the controller determines the first read value is not equal to the first write value.

19. The data storage device of claim 16, wherein the first interface is a host interface and the second interface is a memory interface, and wherein the first voltage level is higher than the second voltage level.

20. The data storage device of claim 16, wherein the controller is further configured to write a second data test to the first memory device through the second interface at a fifth voltage level, wherein the fifth voltage level is a second write value, to read the second data test written to the first memory device through the second interface at a sixth voltage level, wherein the sixth voltage level is a second read value, and to change the sixth voltage level to a seventh voltage level based on a determination of whether the second read value is equal to the second write value, wherein the seventh voltage level is the altered working voltage level.

21. The data storage device of claim 20, wherein the first interface is a host interface and the second interface is a memory interface.

22. The data storage device of claim 20, wherein the fifth voltage level is lower than the sixth voltage level.

23. The data storage device of claim 20, wherein the controller is further configured to alternate writing and reading the first data test through the first interface and the second data test through the second interface.

24. A data storage system, comprising:
a host device; and
a storage device coupled to the host device, the storage device including:
a controller having a host interface coupled to the host device and a memory interface coupled to one or more memory devices, wherein the controller is configured to write a first data test to a first memory device of the one or more memory devices through the host interface at a first voltage level, wherein the first voltage level is a write value, and to read the first data test written to the first memory device through the host interface at a second voltage level, wherein the second voltage level is a read value, wherein the controller is further configured to compare the read value to the write value and to dynamically alter a working voltage level of the system based on a determination of whether the read value is equal to the write value.

25. The data storage system of claim 24, wherein the working voltage level is lower than the first voltage level.

* * * * *